United States Patent [19]
Whetsel

[11] Patent Number: 6,131,171
[45] Date of Patent: Oct. 10, 2000

[54] PROCESS OF TESTING AND A PROCESS OF MAKING CIRCUITS

[75] Inventor: Lee Doyle Whetsel, Plano, Tex.

[73] Assignee: Texas Instruments Incorporated

[21] Appl. No.: 09/265,028

[22] Filed: Mar. 9, 1999

Related U.S. Application Data

[62] Division of application No. 08/929,389, Sep. 14, 1997, Pat. No. 5,905,738, which is a continuation of application No. 08/350,933, Dec. 7, 1994, abandoned, which is a continuation of application No. 07/892,392, May 28, 1992, abandoned, which is a continuation of application No. 07/708,099, May 24, 1991, abandoned, which is a continuation of application No. 07/374,896, Jun. 30, 1989.

[51] Int. Cl.[7] .............................. G06F 11/22; G01R 31/26
[52] U.S. Cl. ............................... 714/35; 714/732; 714/45
[58] Field of Search ................................... 714/732, 731, 714/45, 35

[56] References Cited

U.S. PATENT DOCUMENTS 4,628,511  12/1986  Stitzlein et al. ........................... 714/45
4,929,889  5/1990   Seiler et al. ............................. 714/731

*Primary Examiner*—Ly V. Hua
*Attorney, Agent, or Firm*—Lawrence J. Bassuk; Frederick J. Telecky

[57] ABSTRACT

A digital bus monitor used to observe data on a bus (14, 16, 18) connecting multiple integrated circuits (10, 12) comprises a memory buffer (30), bypass register (34), test port (38) and output control circuits (42, 46) controlled by an event qualifying module (EQM) (32). In response to a matching condition the EQM (32) may perform a variety of tests on incoming data while the integrated circuits (10, 12) continue to operate at speed. A plurality of digital bus monitors (20, 22) may be cascaded for observation and test of variable width data buses and variable width signature analysis.

40 Claims, 6 Drawing Sheets

PERFORMING PARALLEL SIGNATURE ANALYSIS ON ALL ODI INPUTS

PERFORMING SINGLE SIGNATURE ANALYSIS ON ONE ODI INPUT

PROCESS OF TESTING AND A PROCESS OF MAKING CIRCUITS

This application is a division of application Ser. No. 08/929,389, filed Sep. 14, 1997, now U.S. Pat. No. 5,905, 738; which is a continuation of application Ser. No. 08/350, 933, filed Dec. 7, 1994, now abandoned; which is a continuation of application Ser. No. 07/892,392, filed May 28, 1992, now abandoned; which is a continuation of application Ser. No. 07/708,099, filed May 24, 1991, now abandoned, which is a continuation of application Ser. No. 07/374,896, filed Jun. 30, 1989.

TECHNICAL FIELD OF THE INVENTION

This invention relates in general to electronic circuits, and more particularly to a digital bus monitor for observing data on a bus connecting multiple integrated circuits.

BACKGROUND OF THE INVENTION

Traditionally, expensive test equipment has been required to dynamically monitor the functional interactions of integrated circuits on a circuit board design. During test, the integrated circuits are made to operate together functionally while an external tester observes the transactions occurring between the integrated circuits. Other techniques such as boundary scan provide off-line or static testing of wiring interconnects between integrated circuits, but are not effective in detecting at-speed functional problems that can occur in the bussing paths between integrated circuits.

The ability to dynamically (i.e., during normal operation of the circuit board) observe the data passing between integrated circuits in real-time allows monitoring of the functional interactions between multiple integrated circuits on substrate, such as a circuit board. Such a test can reveal timing sensitive and/or intermittent failures that would otherwise not be detectable without the use of expensive testers and mechanical probing fixtures. The ability to dynamically observe system data buses in real-time facilitates system integration, environmental chamber testing, remote diagnostic testing, and built-in self testing.

Heretofore, the ability to dynamically observe digital signals on buses formed of leads on the substrate or circuit board between integrated circuits has been unavailable. Current test methods used to monitor or observe digital signals on signals paths or leads between integrated circuits on substrate or circuit board designs require the use of expensive external tester equipment and signal node probing mechanisms. One problem with the current test approach is that state-of-the-art circuit board designs are so densely populated with integrated circuits that physical probing of the signal paths is very difficult, if not impossible. Another problem is that the circuit board tester is dependent upon the availability of external testers and probing fixtures. Transportation and upkeep of the required test equipment in a field environment to support a system can be a very expensive proposition.

Therefore, a need has arisen to provide a digital bus monitoring device which can be used to dynamically observe data or address signals on bus leads connecting multiple integrated circuits.

SUMMARY OF THE INVENTION

In accordance with the present invention, a digital bus monitor is provided which substantially eliminates or prevents the disadvantages and problems associated with prior digital bus testing devices.

The digital bus monitor of the present invention may be used to observe data on a bus connecting multiple integrated circuits while the integrated circuits are in a functioning mode. Input circuitry is provided for receiving incoming data. Test circuitry is connected to the input circuitry for analyzing and storing data in response to detection of a known or certain condition. The known or certain condition may be detected by comparing data from the logic circuitry to an expected data word stored in a register or memory. Some bits of the expected data word may be masked using a masking data word, such that the masked bits are not involved in the matching operation. Multiple digital bus monitor devices may be cascaded together to allow for observation and test of variable width data buses.

The digital bus monitor of the present invention provides several technical advantages over the prior art. The digital bus monitors of the present invention may be imbedded in the circuit board or substrate design and can be activated throughout the life cycle of the board or substrate, from production testing to field service and maintenance. Another advantage is that the digital bus monitors do not impede the performance of the board's or substrate's circuitry. Since the input signals to be monitored do not have to be routed through the digital bus monitor, but are only input to the digital bus monitor, no significant functional performance penalty is paid while using these devices.

In the second embodiment of the present invention, a second known or certain condition may be detected, at which time the storage and analysis will cease. The storage and analysis may be resumed after detection of a third known or certain condition and stop after the detection of a fourth known or certain condition.

The digital bus monitor of the present invention provides the advantage of analyzing signals or data on data or address buses coupling multiple integrated circuits while the integrated circuits are operating at-speed. The at-speed testing of the integrated circuits detect errors that might not otherwise be found.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION OF INVENTION

The preferred embodiment of the present invention is best understood by referring to FIGS. 1–10 of the drawings, like numerals being used for like and corresponding parts of the various drawings.

Digital Bus Monitor Application

Figure 1:
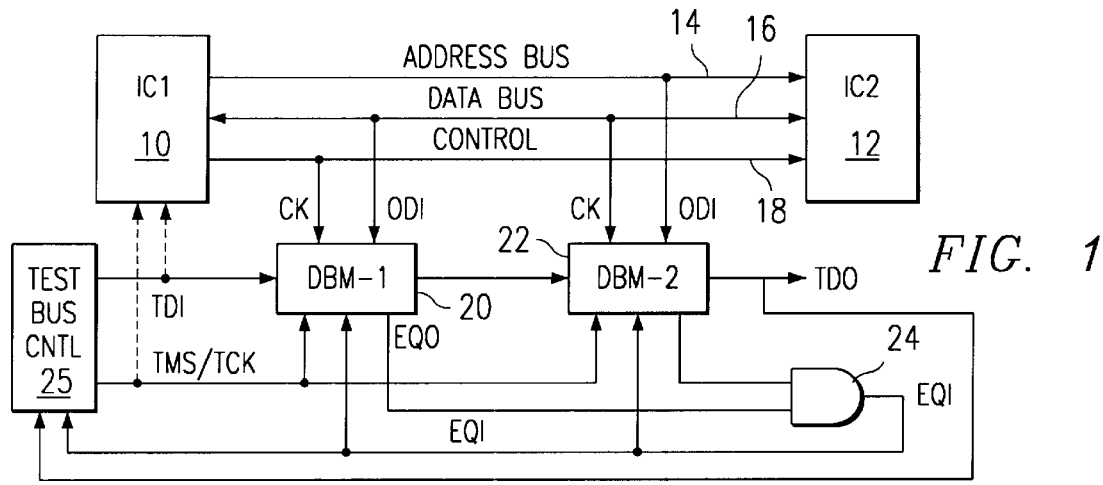
FIG. 1 illustrates a block diagram of an application of the present invention illustrating two digital bus monitor devices coupled to the data and address bus of two integrated circuits.

FIG. 1 illustrates a block diagram of an exemplary circuit using the digital bus monitor (DBM) of the present invention. As illustrated in FIG. 1, two integrated circuits, IC1 10 and IC2 12, are connected by three buses: An address bus 14, a data bus 16, and a control bus 18. Each bus is formed of plural leads affixed to a substrate such as a circuit board. A first data bus monitor DBM1 20 is connected to the control bus 18 by its clock or CK INPUT AND to the data bus 16 via its ODI (observability data input) input. The second data bus monitor DBM2 22 is connected to the control bus 18 via its clock or CK input and to the address bus 14 via its ODI input. DBM1 20 and DBM2 22 are interconnected together via a serial scan path connection comprising a test data input (TDI) and a test data output (TDO). The TDO of DBM1 20 is connected to the TDI of DBM2 22. Control for operation of the DBMs 20 and 22 for scan and off-line test operations is input via the test clock (TCK) and test mode select (TMS) inputs. The TDI, TDO, TCK and TMS scan path signals are compatible with a proposed IEEE standard test bus for integrated circuits. An event qualification output (EQO) is output from each of the DBMs 20 and 22 into an AND gate 24. The output of the AND gate 24 is input to the event qualification inputs (EQI) of each DMB 20 and 22. TMS/TCK and TDI may be supplied by an external test bus controller 25. TMS/TCK and TDI may optionally be input to an IC with internal test circuitry. TDO and EQI are received by the test bus controller from DBM2 22 and AND gate 24, respectively.

In operation, the DBMs 20 and 22 are used to observe and test the digital signals carried on the buses 14–18 connected between the two integrated circuits 10 and 12. DBM devices operate in two modes: off-line test mode and on-line test mode. In the off-line mode, board circuitry is placed in a test mode and control for signal monitoring is input to the DBMs 20 and 22 from the external test bus interface. The external test bus interface includes four signals: TCK, TMS, TDI, and TDO. TCK and TMS are the test clock and test mode select signals, respectively, from the external test controller. TDI and TDO are the serial test data input and output signals used to connect DBMs and other devices conforming to the IEEE interface specification. Using the on-line mod, the board circuitry is functioning normally, and control for monitoring comes from the DBMs internal event qualification module (EQM) which is described in detail in connection with FIG. 7.

In the exemplary circuit of FIG. 1, IC1 10 outputs address and control signal information to IC2 12 to allow data signals to pass between the two integrated circuits. First and second DBMs 20 and 22 are included in the circuit of FIG. 1 to provide for monitoring the signals on the data and address paths or leads between IC1 10 and IC2 12. The address and data bus signals to be monitored are input to the DBMs via ODI leads. If the DBMs were not included in the circuit example of FIG. 1, external probes would have to be connected to these data paths or leads to achieve the level of signal observability provided by the DBMs.

When the circuits are placed in an off-line test mode, IC1 10 and IC2 12, can be controlled so that the address and data bus paths or leads 14 and 16 can be monitored by the first and second DBMs 20 and 22. During the test, IC1 10 can be made to output data on its address and data buses or leads 14 and 16. The data and address output from IC1 10 can be captured into both DBMs 20 and 22 via ODI 14, 16 inputs. After the data has been captured, it can be shifted out for inspection via the serial scan path from the TDI input pin of DBM1 20 to the TDO output pin DBM2 22.

Similarly, IC2 12 can be made to output data on the data bus leads 16 to be captured and shifted out for inspection by the first DBM 20. In this off-line test mode, control to capture data and operate the scan path is input via the TCK and TMS test bus input pins.

When the circuit of FIG. 1 is on-line and functioning normally, the first and second DBMs 20 and 22 can continue to monitor the data and address buses 14 and 16 using the internal EQM circuitry described below. During on-line monitoring the internal EQM of each DBM device 20 and 22 outputs control signals to capture the data appearing on the ODI inputs of the respective DBMs. The internal EQM operates synchronous to the control signal outputs from IC1 10 which are input to each DMB via the clock or CK inputs. To know when to capture data, the EQM circuitry within each DMB 20 and 22 has comparator logic which can match the data appearing on the ODI inputs against a known or certain expected data pattern or set of expected data patterns.

To expand the event qualifying capability, multiple DBMs (or other devices containing the EQM and the EQI and EQO pins) can be connected together on an external combining network 24, such as AND gate 24, to allow the qualification of a test monitor operation to be controlled by the events detected over a range of DBM devices. When expanded qualification is required, each DBM outputs a match condition signal on its EQO output pin. The EQO outputs of multiple DBMs are input to an external combining circuit or AND gate 24 to produce a global event qualifier (EQI) input signal that is fed back into each DBM via their EQI input pins. When a matched signal is input on the EQI pin, the internal EQM can initiate a test monitor operation. The operation and protocol of the Event Qualification Module are described in U.S. Pat. No. 5,103,450, entitled "Event Qualified Testing Architecture For Integrated Circuits," and U.S. Pat. No. 5,103,450, entitled "Event Qualified Testing Protocols For Integrated Circuits," both filed Feb. 9, 1989 by Whetsel, both of which are incorporated by reference herein.

The test bus controller 25 can control the shifting of data through the DBMs (and other devices). The combined EQI signals is monitored by the test bus controller 25 to determine when a known or certain condition occurs. In response to one or more known or certain conditions, the test bus controller can scan out the data stored in the DBM and other devices. Test protocols and conditions are discussed in connection with FIGS. 7a–d hereinbelow.

Digital Bus Monitor Architecture

Figure 2:
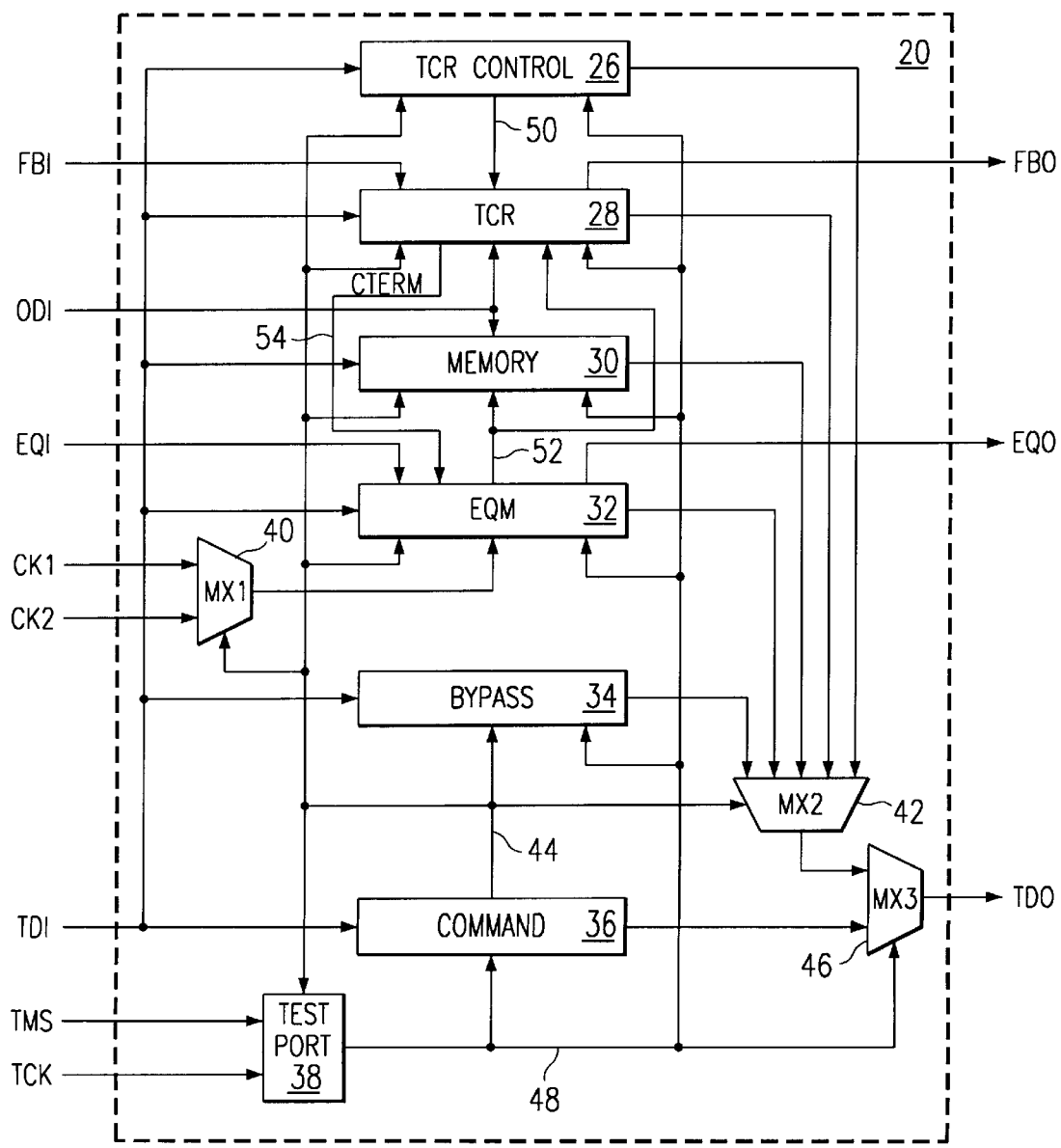
FIG. 2 illustrates a block diagram of the digital bus monitor integrated circuit.

FIG. 2 illustrates a block diagram of the DBM of the present invention, referenced generally as 20. The DBM integrated circuit comprises a test cell register control circuit (TCR control) 26, test cell register (TCR) 28, memory buffer 30 (memory), event qualification module (EQM) 32, bypass register (bypass) 34, command register (command) 36, and test port 38. The DBM 20 has the following inputs and outputs: feedback input (FBI), ODI, EQI, clock 1 (CK1), clock 2 (CK2), TDI, TMS, TCK, feedback outputs (FBO), EQO, and TDO. FBI is input to the TCR 28. ODI is input to the TCR 28 and the memory, EQI is input to the EQM 32. A first multiplexer (MX1) 40 receives inputs from CK1 and CK2, and outputs a CK1/2 signal to the EQM 32. TDI is input to the Command Register 36, Bypass 34, EQM 32, memory 30, TCR 28 and TCR Control 6. TMS and TCK signals are input to the Test Port 38. The command register 36 is connected to the test port 38, MX1 40, a second multiplexer (MX2) 42, a bypass register 34, EQM 32, memory buffer 30, TCR 28 and TCR control 26 via a command bus 44. The test port 38 is connected to a third multiplexer (MX3) 46, the command register 36, bypass register 34, EQM 32, memory 30, TCR 28, and TCR control 26 via a test bus 48. The serial outputs of the data registers TCR control 26, TCR 28, memory 30, EQM 32 and bypass 34 are connected to the inputs of MX2 42 which is controlled by the signal from the command bus 44. The output of MX2 42 is connected to a first input to MX3 46. The other input to MX3 46 is received from the serial data output of the command register 36. The output of MX3 46 is connected to the TDO output. The EQO output is provided by the EQM 32 and the FBO output is received from TCR 28. TCR 28 receives control signals from TCR control 26 over control bus 50. EQM 32 outputs signals to memory 30 and TCR 28 via EQM bus 52. EQM 32 receives signals from TCR 28 via TCR bus 54.

The DMB Architecture has a four-wire test bus input (TCK, TMS, TDI and TDO) and parallel access of multiple internal scan paths which is consistent with the proposed P1149.1 IEEE standard. When control is input to the test port 38 via the TMS and TCK inputs, serial data is loaded and shifted in from the TDI input through either the command register 36 or one of the selectable data registers 26–34 from the TDI input to the TDO output.

The test port 38 responds to the test bus protocol which is input via the external TMS and TCK; inputs to load and then shift data through either the command register 36 or one of the five selectable data registers 26–34. Control input from command register 36 via control bus 44 is input to the test port 38. This control input enables the clock output to a selected data register 26–34 during a data register scan operation. The selected data register clock output can also be used to control the EQM 32 and/or TCR 28 during off line test monitor operations. The data and command register clock outputs, along with other control signals, are output from the test port 38 via control bus 48.

When selected, the command register receives control from the test port 38 via control bus 48 to shift data from the TDI input to the TDO output. The instruction shifted into command register 36 is used to select one of the data registers 26–34 to be connected to the TDO output via multiplexers MX2 42 and MX3 46. When selected, a data register can receive control from the test port 38 via control bus 48 to shift data from the TDI input to the TDO output. In addition to selecting a data register for scan access, the instruction in the command register 36 can also output the control required to execute a test monitor operation in the DMB 20.

Bypass register 34 comprises a single scan cell. When selected via command bus 44 and control bus 48, bypass register 34 couples the TDI input to the TDO output through a single shift register stage. The bypass register 34 is used to provide an abbreviated scan path through the DBM.

The EQM 32 is a circuit which is used to control the operation of the TCR 28 and memory 30 during on line test monitoring operations. The EQM 32 receives input from the external EQI input, a selectable clock output signal from MX1 40, a compare term (CTERM) signal output from TCR 28, command bus 44, and control bus 48. The EQM 32 outputs test control signals to TCR 28 and memory 30 via bus 52, and also outputs compare results on the external EQO output signal. The EQM 32 is described in greater detail in connection with FIG. 7.

The memory 30 is used to store incoming data during test monitor operations. The memory 30 receives input from the external ODI input, the command bus 44, the EQM bus 52, and the control bus 48.

The TCR 28 is used to capture or compress incoming data during test monitor operations. The TCR 28 receives input from the external FBI signal, the external ODI input, the command bus 44, the EQM bus 52, and the control bus 48. The TCR outputs an external FBO signal, and a CTERM signal to the EQM 32.

The TCR control register 26 is used to store configuration signals that are used to mask off ODI inputs to the TCR 28, select the TCR's polynomial tap configuration and adjust the TCR 28 for cascading with TCRs in other DBM devices. The TCR control register 26 receives input from the command bus 44, and control bus 48. The TCR control register 26 outputs control to the TCR 28 via bus 50.

MX1 40 is used to select one of the two external clock inputs to be applied to the EQM 32. MX1 40 has one output, CK1/2 and two inputs, external CK1 input and external CK2 input. MX1 40 is controlled by the command register 36 via the command bus 44. It should be noted that more than two external clocks can be input to the DMB 20, depending upon the available pins. The additional clocks allow the DBM to synchronize with multiple timing sources.

MX2 42 is used to select one of the serial outputs from the five selectable data registers 26–34 to be input to MX3 46. MX2 42 selects its output from the serial data outputs the bypass register 34, EQM 32, memory 30, TCR 28 and TCR control register 26, MX2 42 is controlled by the command register 36 via the command bus 44.

MX3 46 is used to couple the serial data output from the command register 36 or the output of MX2 42 to the external TDO output. MX3 is controlled by the test port 38 via the test bus 48.

DBM Input/Output Descriptions

Figure 3:
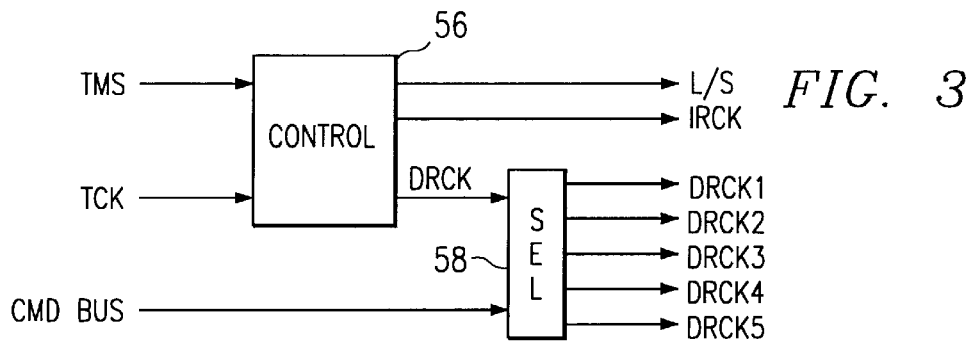
FIG. 3 illustrates a block diagram of the test port used in the present invention.

The DBM's TDI input and TDO output of FIG. 3 are wired such that a leading device's TDO output drives into the DBM'2 TDI input and a following device's TDI input is driven by the DBM's TDO output. The TCK and TMS input signals are connected in parallel to multiple DBMs or other devices with the same standard test bus interface. An example of this interconnect scheme is in FIG. 1.

The ODI inputs of the DBM in FIG. 2 are connected to a digital bus path that is to be monitored (see FIG. 1). For purposes of illustration, it is assumed that the DBM 20 has an ODI input bus width of 16 bits, to allow simultaneous monitoring of 16 bit wide buses. However, DBMs could be designed with wider ODI input bus widths to allow monitoring of buses wider than 16 bits. By cascading 16 bit DBMs, it is possible to monitor bus widths of 32, 48, 64, etc. Also, the data compression capability of the internal TCR can be expanded in multiples of 16 bits by cascading a series of DBMs together and making the appropriate feedback wiring connections on the DBMs FBI and FBO signals pins.

The DBM's CK1 and CK2 input pins are connected to a system clock source which is synchronous to occurrence of valid data on the ODI inputs. The two clock inputs, CK1 and CK2, allow selection of one of two possible clock source inputs to be used during on line monitoring. The selected clock source is routed through MX1 42 and is input to the EQM 32. During on line monitoring the EQM 32 operates synchronously with the selected clock input to issue control to the TCR 28 and/or memory 30 to capture to data appearing on the ODI inputs. If required, clock signals or other control signals in addition to the two clock signals illustrated could be input to the DBM.

The DBMs' EQI inputs and EQO outputs are connected to an external logic and feedback network comprising an AND gate 24 as shown in FIG. 1. The external feedback allows multiple DBMs and/or other devices that include the event qualification architecture to operate together to qualify and on line test operation. Although an AND gate 24 is illustrated in FIG. 1 for the combining circuit other logic circuits, such as an OR gate could be used for the external feedback network. For example, if the EQO signals output a logic "1" in response to a match, an AND gate will detect the occurrence of all ones. However, if EQO signals output a logic "0" in response to a match, an OR gate can be used to detect all zeros.

Test Port

In FIG. 3, the design of the test port is shown. The test port comprises a control section 56 and a clock select section 58. The control section receives external control from the TMS and TCK inputs and outputs internal control on the load/shift (L/S) control output, an instruction clock output (IRCK) and data clock outputs (DRCK). In the preferred embodiment, the control section 56 conforms to the proposed IEEE test bus standard protocol to load and shift data through either the command register 36 or a selected data register 26–34. The clock select section receives inputs from command bus 44 and DRCK, and outputs five clocks (DRCK1–DRCK5) onto the control bus 48.

Figure 3A:
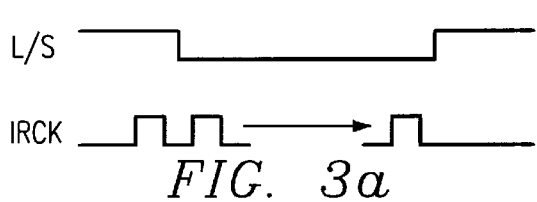
FIG. 3a illustrates a timing diagram for the command register load/shift scan operation.

In FIG. 3a a load operation occurs on the command register when the L/S control output is high and the IRCK clock is applied. After the load operation has occurred, the L/S control output is set low to shift out the data loaded during each IRCK clock output. After the shift operation is complete, the IRCK clock output is set low, and the L/S output returns high.

Figure 3B:
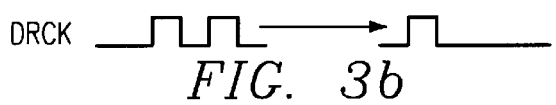
FIG. 3b illustrates a timing diagram for the data register load/shift scan operation.

In FIG. 3b, a load operation occurs on a selected data register 26–34 when the L/S output is high and the DRCK clock is applied. After the load operation has occurred, the L/S control output is set low to shift out the data loaded during each DRCK clock output. After the shift operation is complete, the DRCK outputs are set low and the L/S output returns high.

The instruction loaded into the command register 36 selects which data register 26–34 will receive clock inputs during data register scan operations. The control to select one of the data register clocks (DRCK1–5) is input to the select logic 58 via the command bus 44. The selected data register clock will transition with the DRCK during data register scan operations.

Command Register

Figure 4:
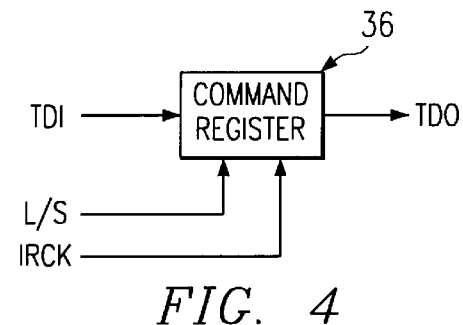
FIG. 4 illustrates a block diagram of the command register used in the present invention.

FIG. 4 illustrates the design of the command register 36. The command register 36 is used to store test instructions. The command register 36 receives serial input on the TDI input and control input from the test port 38 via the L/S and IRCK signals on the control bus 48. The command register 38 outputs serial data on the TDO output signal. The command register comprises a series of scan cells (see FIG. 5) interconnected together to form a shift register.

During instruction register scan operations, the L/S and IRCK outputs from the test port 38 are activated to load and shift data through the command register 36 from the TDI input to the TDO output. During the load operation, the L/S and IRCK inputs cause the command register cells to load the data attached to one input of a 2:1 multiplexer. The data loaded can be either a fixed binary pattern or variable status inputs. After the load operation, the L/S control input selects the other input of the 2:1 multiplexer to link the scan cells together to shift data through the DBM from the TDI input, through the instruction register to the TDO output, and then to the MX3 46, where the data is selectively output to the TDO signal.

Bypass Register

Figure 5:
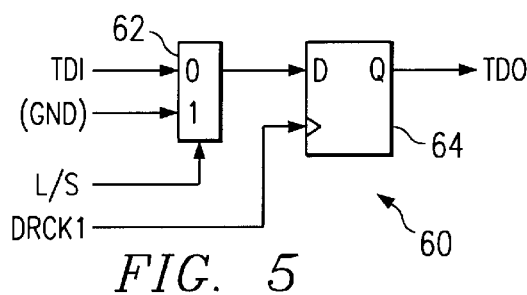
FIG. 5 illustrates a block diagram of the bypass register used in the present invention.

FIG. 5 illustrates the design of the bypass register 34. The bypass register 34 comprises a single scan cell 60 and is used to shorten the DBM's data scan path to only a one bit length. The scan cell 60 comprises a 2:1 multiplexer 62 and a D-flip flop 64. When selected, the scan cell 60 receives L/S and DRCK1 control inputs from the test port 38 via control bus 48 to load the data attached to one input of the 2:1 multiplexer 62. After the load operation, the L/S control input 101 selects the other input of the 2:1 multiplexer 62 to shift data through the DBM 20 from the TDI input, through the bypass register 34 scan cell to the TDO output of the bypass register 34, and then to the TDO 106 output of the DBM 20, via MX2 42 and MX3 46.

TCR Control Register

Figure 6:
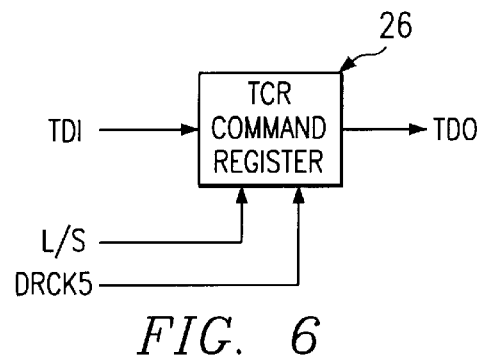
FIG. 6 illustrates a block diagram of the test cell control register used in the present invention.

FIG. 6 illustrates the design of the TCR control register 50. The TCR control register 50 comprises a series of scan cells similar to the bypass scan cell 60 shown in FIG. 5. The TCR control register 50 receives serial input on the TDI input and control input from the test port 38 via the L/S and DRCK 5 signals on the control bus 48. The TCR control register 50 outputs serial data on the TDO output signal. When selected, the scan cells in the TCR control register receive L/S and DRCK5 control signals to load the data attached to one input of a 2:1 multiplexer. In the TCR control register 50 the multiplexer input selected while L/S is high is attached to the scan cell's Q output so that the cells remain in their present state during the load operation. After the load operation, the L/S control input selects the other input of the 2:1 multiplexer to link the scan cells together to shift data through the DBM from the TDI input, through the TCR control register, to the TDO output, and then to the TDO output of the DBM.

Event Qualification Module

Figure 7:
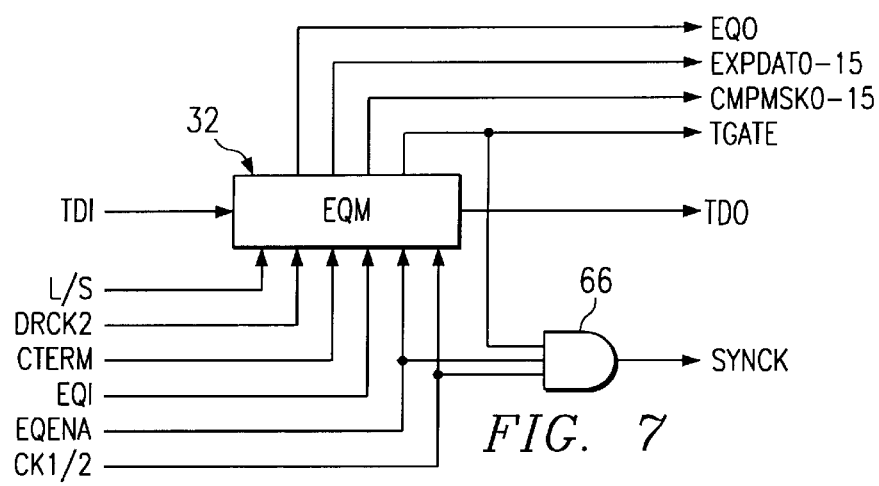
FIG. 7 illustrates a block diagram of the event qualification module used in the present invention.
Figure 7A:
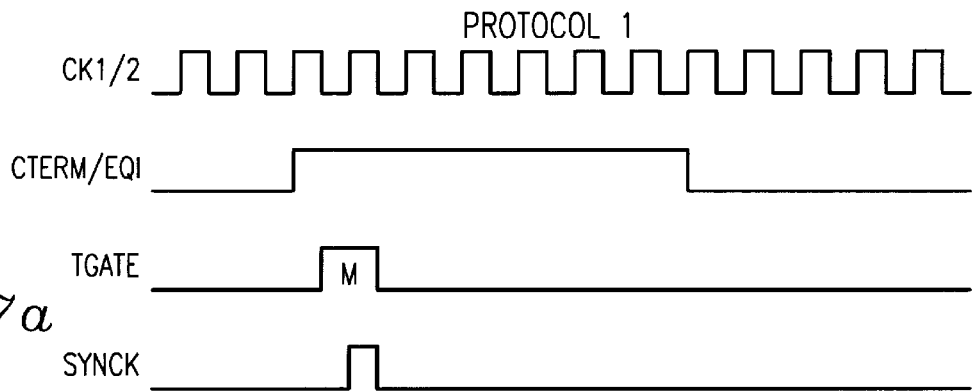
FIG. 7a illustrates a timing diagram of a single test monitor operation in response to a condition input.
Figure 7B:
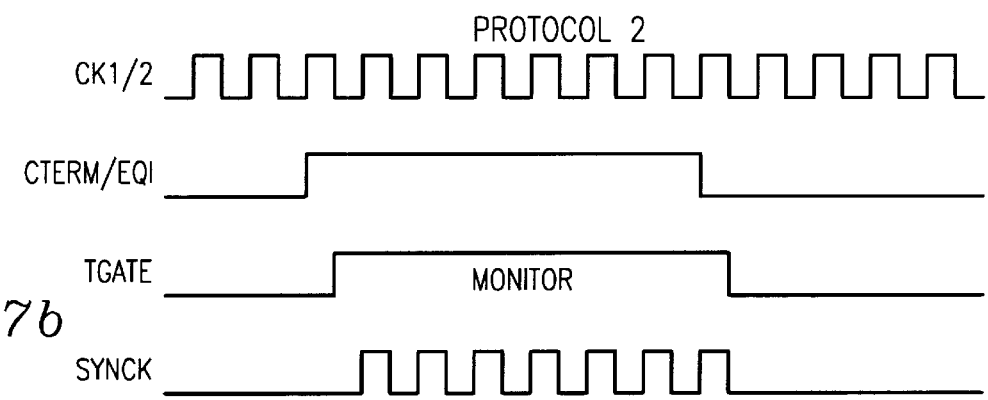
FIG. 7b illustrates a timing diagram of a test monitor operation while the condition input is present.
Figure 7C:
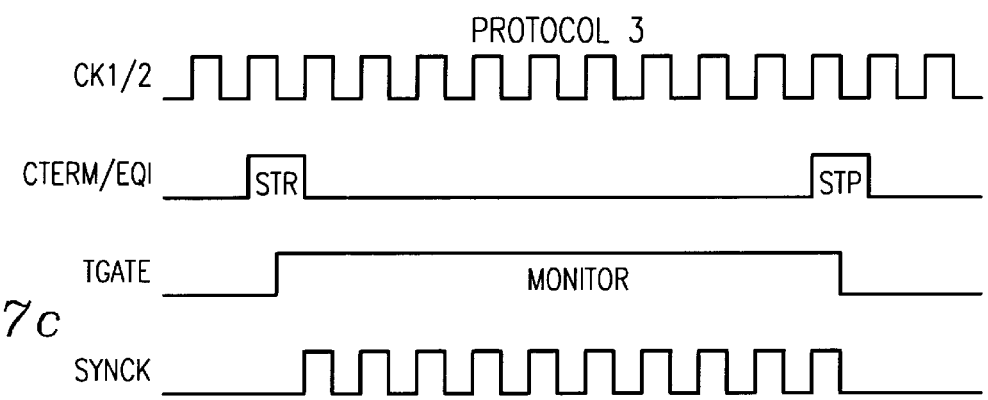
FIG. 7c illustrates a timing diagram of a test monitor operation between start and stop condition inputs.
Figure 7D:
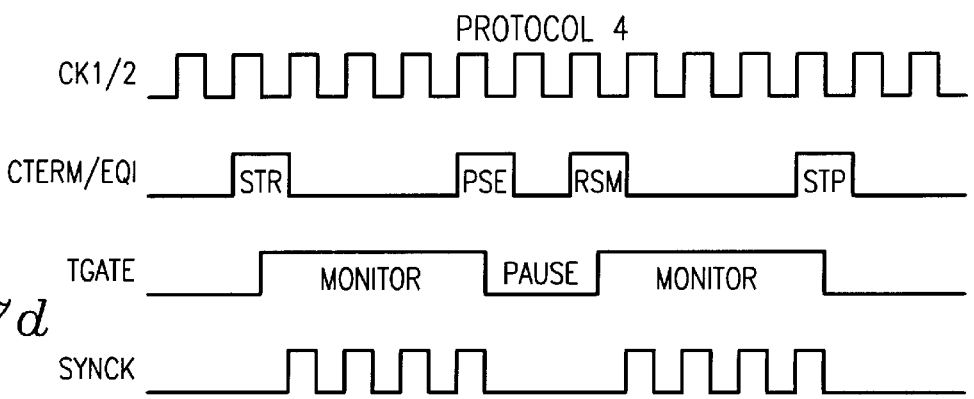
FIG. 7d illustrates a test monitor operation started with a first condition input, paused with a second condition input, resumed with a third condition input, and stopped with a fourth condition input.

FIG. 7 illustrates a block diagram of the EQM 32. The EQM receives seven signals: TDI, L/S, DRCK2, CTERM (from TCR 28), EQI, EQENA (from the command register 36) and CK1/2. The EQM 32 has six outputs: EQO, EXPDAT 0–15, CMPMSK 0–15, TGATE, TDO, and SYNCK. The SYNCK output is generated through AND gate 66, having inputs of TGATE, EQENA, and CK1/2. A detailed description of the EQM is provided in the U.S. patent application Ser. No. 308,272, referenced above.

The EQM 32 has a scan path which contains an EQM command register, an event loop counter, a configuration bits register, start and stop expected compare data registers, and start and stop mask compare data registers. When selected, the L/S and DRCK2 control inputs from the test port 38 via control bus 48 cause the EQM scan path to load and shift data from the TDI input, through the EQM 32 to the TDO of the EQM 32, and then to the TDO output of the DBM 20 via MX2 42 and MX3 46.

The EQM 32 receives condition input from the internal CTERM signal and external EQI signal. The EQM 32 can respond to a condition input on a selected one of these two condition inputs to execute an on line event qualified test monitor operation. The EQM receives external clock input from the CK1/2 output from MX1 40 in FIG. 2. The EQM 32 operates synchronous to CK1/2 input during execution of an on-line event qualified test monitor operation. The EQM 32 receives input from the EQM enable (EQENA) signal output from the command bus 44. When EQENA is set high, the EQM controller (internal to the EQM 32) is enabled to output the required control, in response to a condition input, to execute an event qualified test monitor operation in the TCR and/or memory buffer.

When the EQENA is set high, the EQM is enabled to output expected compare data (EXPDAT) and mask compare data (CMPMSK) to the TCR 28. The EXPDAT pattern is used to compare the input signals appearing on the ODI inputs against a certain or expected input pattern. The CMPMSK pattern is used to mask off a compare operation on one or more of the ODI input signals, to where it has no effect on the compare operation being performed. In the preferred embodiment, the EQM 32 has storage to hold multiple sets of EXPDAT and CMPMSK data patterns.

When a match is found between incoming data on the ODI inputs and the EXPDAT, the EQM 32 outputs a high logic level on the TGATE output. The TGATE output is routed to the TCR 28 and memory 30 to enable a test monitor operation. Also, when the TGATE output is high, the AND gate 66 in FIG. 7 is enabled to pass the CK1/2 clock input to the SYNCK signal. The SYNCK signal is routed to the TCR 28 and memory 30 to provide clocking for an on-line test monitor operation. In addition, the EQM 32 outputs the occurrence of a match condition on the external EQO output signal to inform neighboring devices of the match. The EQO signal can be used to qualify a more global event qualified test operation using the external AND feedback network 24 shown in FIG. 1.

The EQM 32 can perform four types of event qualified testing protocols. Timing diagrams for each of the four types of protocols are shown in FIGS. 7a, 7b, 7c and 7d. A protocol 1 operation allows for performing a single test monitor operation in response to a certain condition input. A protocol 2 operation allows for performing a test monitor operation while the certain condition input is present. A protocol 3 operation allows for performing a test monitor operation over an interval of time between a start condition input and a stop condition input. A protocol 4 operation allows for performing a test monitor operation which can be started with a first condition input, paused with a second condition input, resumed with a third condition input, and stopped with a fourth condition input. All the protocols can be made to repeat a desired number of times as determined by the EQM's internal event loop counter. The operation of the EQM and its protocols are described in detail in U.S. patent application Ser. No. 308,272 and U.S. patent application Ser. No. 308,273, reference above.

Memory Buffer

Figure 8:
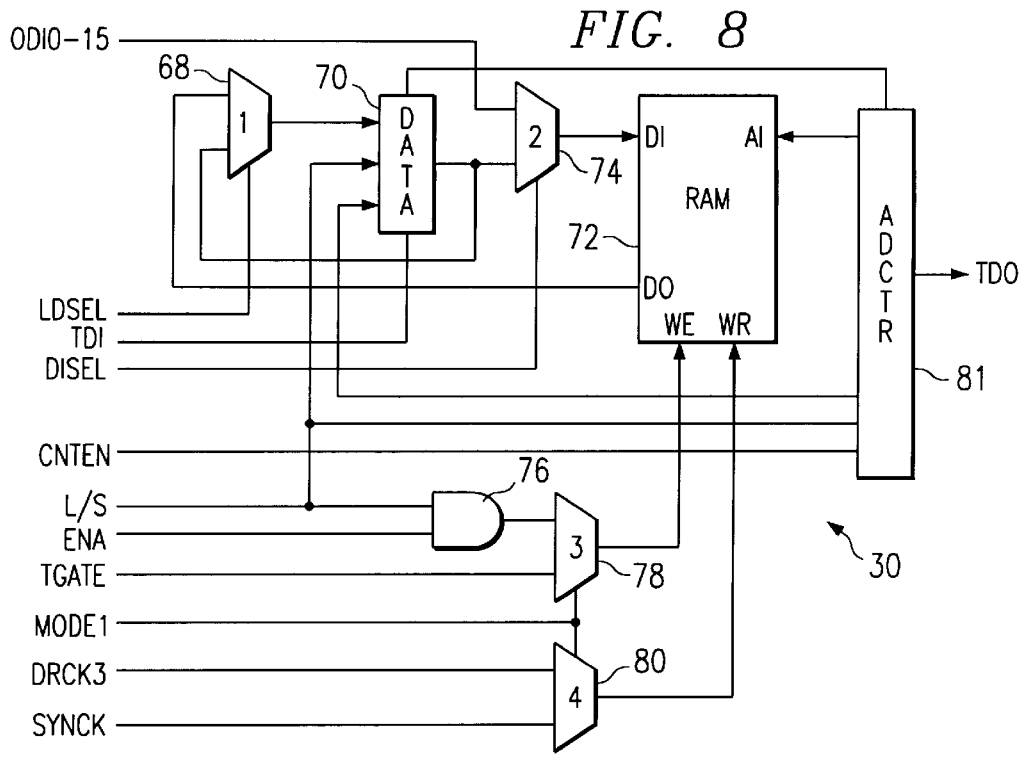
FIG. 8 illustrates a block diagram of a memory buffer used in the present invention.

FIG. 8 illustrates a block diagram of the memory buffer 30. The memory buffer 30 receives the L/S and DRCK3 via the control bus 48, a MODE1, ENA, CNTEN, DISEL, and LDSEL signals via the command bus 44, the SYNCK and TGATE signals from the EQM 32 via the EQM bus 52, the TDI signal and the ODI signals (shown for the sixteen-bit implementation). The memory buffer 30 outputs a TDO signal. A first multiplexer 68 has inputs received from a data register 70 and a RAM memory 72. The first multiplexer 68 is under the control of the LDSEL signal. The output of the first multiplexer 68 is connected with the data register 70. A second multiplexer 74 has one input connected to the data register 70 and the other input connected to the ODI signal. The output of the second multiplexer is connected to the RAM 72 under control of the DISEL signal. The L/S signal is also connected to an AND gate 76 along with an ENA signal. The output of the AND gate 76 is connected to a third multiplexer 78 along with the TGATE signal. The DRCK3 signal and SYNCK signal are input to a fourth multiplexer 80. Both the third multiplexer 78 and fourth multiplexer 80 are controlled by the MODE1 signal. The output of the third multiplexer 78 is connected to the write enable 10 of the RAM 72. The output of the fourth multiplexer 80 is connected to the read/write pin (WR) of the RAM 72. The output of the fourth multiplexer 80 is also connected to the data register 70 and to an address/counter 81. The output of the address/counter 81 is connected to the address pins of the RAM 72. The address/counter 81 is also connected to the L/S signal, the CNTEN signal and to the data register 70. A TDO signal is also output from the address/counter 81. The data register 70 also is connected to the L/S signal, the output of the fourth multiplexer 80, and to the TDI signal.

The memory buffer 30 comprises a static design random access memory (RAM) 72, a scan path, and required interface logic and multiplexers. The RAM memory 72 has a data input width equal to the number of ODI input signals and sufficient depth for maximum data storage. The scan path consists of a data register 70 and an address/counter 82. When selected, control inputs L/S and DRCK3 from the test port 38 via control bus 48 causes the scan path to load and shift data from the TDI input through the data register 70 and address/counter 81 to the TDO output of the memory 30, and then to the TDO output of the DBM 20 via the MX2 42 and MX3 46. During scan operations, the MODE1 input from the bus 44 is set to allow the DRCK3 input to pass through the fourth multiplexer 80 to clock the data register 70 and address/counter 81 sections of the scan path.

During a memory read instruction, the scan path load and shift operations are used to extract the contents of the RAM 72. During this instruction, the ENA input from the command bus 44 is low to disable RAM write operations, and the first multiplexer 68 is set by the load select (LDSEL) signal from command bus 44 to allow the data register 70 of the scan path to load the memory location addressed by the address/counter 81. The address/counter section 81 remains in its present state during the scan load operation. After a load operation, the L/S input is set low so that the scan can shift out the RAM data location and read and shift in the next RAM address to be read during the next scan path load/shift operation. This scan path load/shift process is repeated until all the RAM memory locations have been loaded and shifted out.

During a memory write instruction, the scan path load and shift operations are used to load data into the RAM 72. During this instruction, the first multiplexer 68 is set by the LDSEL input to allow the data register 70 of the scan path to remain in its present state during the load operation. Also, the second multiplexer 74 is set by the data input select (DISEL) signal from command bus 44 to allow the RAM inputs to be driven by the data in the data register 70 of the scan path. Also, the ENA input from the command bus 44 is set high to enable the RAM 72 to accept data input during the scan path load operation. During the load operation, the RAM write enable (WE) input is high by the ENA and L/S inputs being high, and the DRCK3 clock pulse causes the RAM 72 to accept the data input from the second multiplexer 74 into the location addressed by the address/counter 81. After the load operation, the scan path is shifted to load the next data and address pattern. Since the L/S input goes low during the shift operation, the WE input is low and the DRCK3 inputs that occur during shifting do not cause further RAM write operations. This load/shift process is repeated until the RAM memory has been filled.

During off line data buffering operations, the CNTEN input from the command bus 44 is set high to enable the address/counter for count up operations. The MODE1 input is set to allow the DRCK3 input to drive the RAM's WR input, data register 70, and address/counter 81 via the fourth multiplexer 80. The LDSEL input is set so that the data register 70 remains in its present state when DRCK3 clocks are applied. Also, the MODE1 allows the high logic level inputs on the ENA and L/S signals to activate the RAM WE input through the third multiplexer 78. The DISEL input is set to allow the ODI signals to be input to the RAM 72 via the second multiplexer 74.

The address/counter 81 is set to zero prior to executing a data buffering operation. During off line data buffering, test port 38 is set up so that external control input via the TMS and TCK signals can activate clock pulses on the DRCK3 output. When a high clock pulse occurs on the DRCK3 signal, data on the ODI inputs are written into the currently addressed RAM location. When the clock pulse on DRCK3 returns low, the address/counter 82 increments to the next RAM address location. This process of storing the data input on the ODI signals, followed by incrementing the address/counter 81, is repeated while DRCK3 clock inputs are enabled via the external test bus control signals.

During on line data buffering operations, the CNTEN input is set high to enable the address/counter 81 for count up operations. The MODE1 input is set to allow the gated SYNCK input from the EQM 32 to drive the RAM WR input, data register 70 and address/counter 81. The LDSEL input is set so that the data register 70 remains in its present state when SYNCK clocks are applied. The SYNCK clock input is enabled while the TGATE input from the EQM 32 is high and is gated off while the TGATE input is low. Also, the MODE1 input is set to allow the TGATE input from the EQM 32 to activate to the RAM WE input via the third multiplexer 78, while TGATE is high. The DISEL input is set to allow the ODI signals to be input to the RAM via the second multiplexer 74.

The address/counter 81 is set to zero prior to executing a data buffering operation. On line data buffering is initiated when the EQM 32 sets the TGATE signal high. While TGATE is high, the RAM WE is high and SYNCK clocks are enabled to clock the RAM 72 and address/counter 81. When a high clock pulse appears on the SYNCK clock, data on the ODI inputs are written into the currently addressed RAM location. When the SYNCK clock returns low, the address/counter 81 increments to the next RAM address location. This process of storing the data input on the ODI signals, followed by incrementing the address/counter 81 is repeated, while the TGATE input signal from the EQM 32 is set high.

Test Cell Register (TCR)

Figure 9:
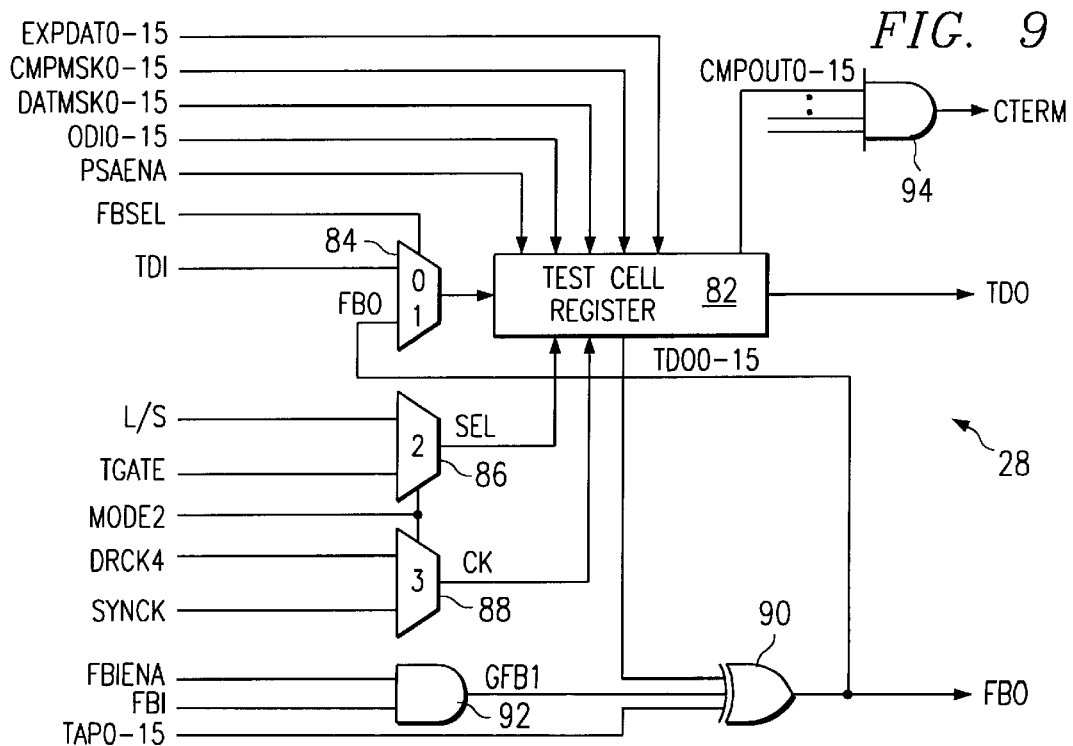
FIG. 9 illustrates a block diagram of the test cell register used in the present invention.

FIG. 9 illustrates a block diagram of the TCR 28. The TCR 28 includes a register 82 comprised of a series of test cells interconnected to form a test register. The test register 82 is described in detail in U.S. Pat. No. 5,495,487 to Whetsel, entitled "Testing Buffer/Register," filed Oct. 3, 1988, which is incorporated by reference herein. Each test cell in the test register 82 is connected to a respective bit (0–15) of the EXPDAT, CMPMSK, DATMSK and ODI signals. The test cell register 82 also receives a PSAENA signal from the command register 36 via the command bus 44 and the output of first, second and third multiplexers 84, 86, and 88. Multiplexer 84 receives the TDI input and an FBO signal. The FBO signal received by the multiplexer 84 is the output of an exclusive or network 90, which is part of the TCR 28. The multiplexer 84 is controlled by the FBSEL signal from the TCR control register 26. Multiplexer 86 has the L/S and TGATE signals as inputs and is controlled by the MODE2 signal from the command register 36 via the command bus 44. Multiplexer 88 receives the DRCK4 and SYNCK signals and is also controlled by the MODE2 signal. The EXOR gate network 90 receives TDO0–15 inputs from the test cell register 82, TAP 0–15 signals, and the output of an AND gate 92. The AND gate 92 receives an FBIENA signal from the TCR control register 26 and the FBI signal. The test cell register 82 outputs CMPOUT signals for each test cell in the register; the signals are input to an AND gate 94 which outputs the CTERM signal. The test cell register 82 also outputs a TDO signal. The number of test cells in the test register is equal to the number of ODI input signals.

The test register 82 receives input from the L/S and DRCK4 test port signals to load and shift data through the test register 82 from the TDI input to the TDO output of FIG. 9. During scan operations, the feedback select (FBSEL) signal from the TCR control register 26 is set to allow the TDI signal to be input to the test register 82 via multiplexer 84. Also, during scan operations, the MODE2 input from the command register 36 is set to allow the L/S and DRCK4 inputs to be passed through multiplexers 86 and 88 for input to the test register 82 via the SEL and CK inputs, respectively.

Figure 9A:
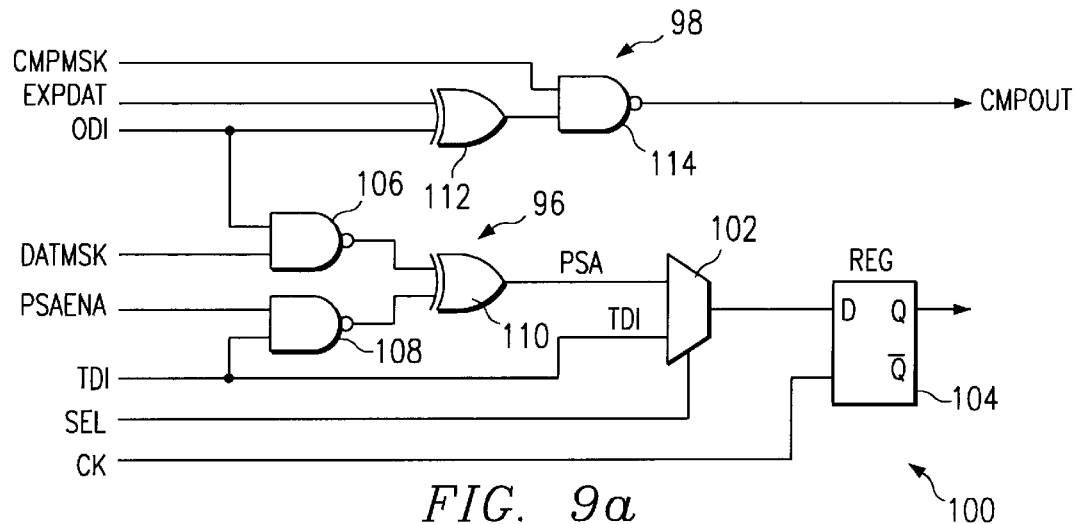
FIG. 9a illustrates a block diagram of a test cell used in the present invention.

An example test cell design used to construct the test register is shown in FIG. 9a. The test cell comprises a maskable PSA logic 96, maskable comparator logic 98, and a scan cell 100 comprising a 2:1 multiplexer 102 and a D flip flop 104. The maskable PSA logic 96 comprises NAND gates 106 and 108 and EXOR gate 110. NAND gate 106 receives inputs from an ODI input signal and a DATMSK input signal from the TCR control register 26, NAND gate 108 receives a PSAENA input signal from command register 36, and a TDI input signal from a leading scan cell's TDO output. The EXOR gate 110 receives the outputs of NAND gates 106 and 108 and outputs a PSA signal to the 2:1 multiplexer 102.

The maskable comparator logic 98 comprises EXOR gate 112 and a NAND gate 114. EXOR gate 112 receives inputs from an ODI input signal and an EXPDAT input signals from the EQM 32. NAND gate 114 receives a CMPMSK signal and the output of EXOR gate 112 and outputs a CMPOUT signal to indicate a match at that cell. The scan cell's 2:1 multiplexer 102 receives the PSA signal and a TDI signal input to the test cell. The multiplexer 102 outputs a signal to the D input of the D flip flop 104 under control of the SEL signal from multiplexer 86 (FIG. 9). The D flip flop 104 receives a data input from the 2:1 multiplexer 102 and a clock (CK) input from the multiplexer 88 (FIG. 9). The operation of each of these logic sections is described in a truth table in TABLE I.

TABLE I

Scan Cell Truth Table

| Sel | Clk | Operation |
|---|---|---|
| 0 | / | Shift (TDI to TDO) |
| 1 | / | Load (PSA to TDO) | where "/" is a rising clock edge

Figure 9B:
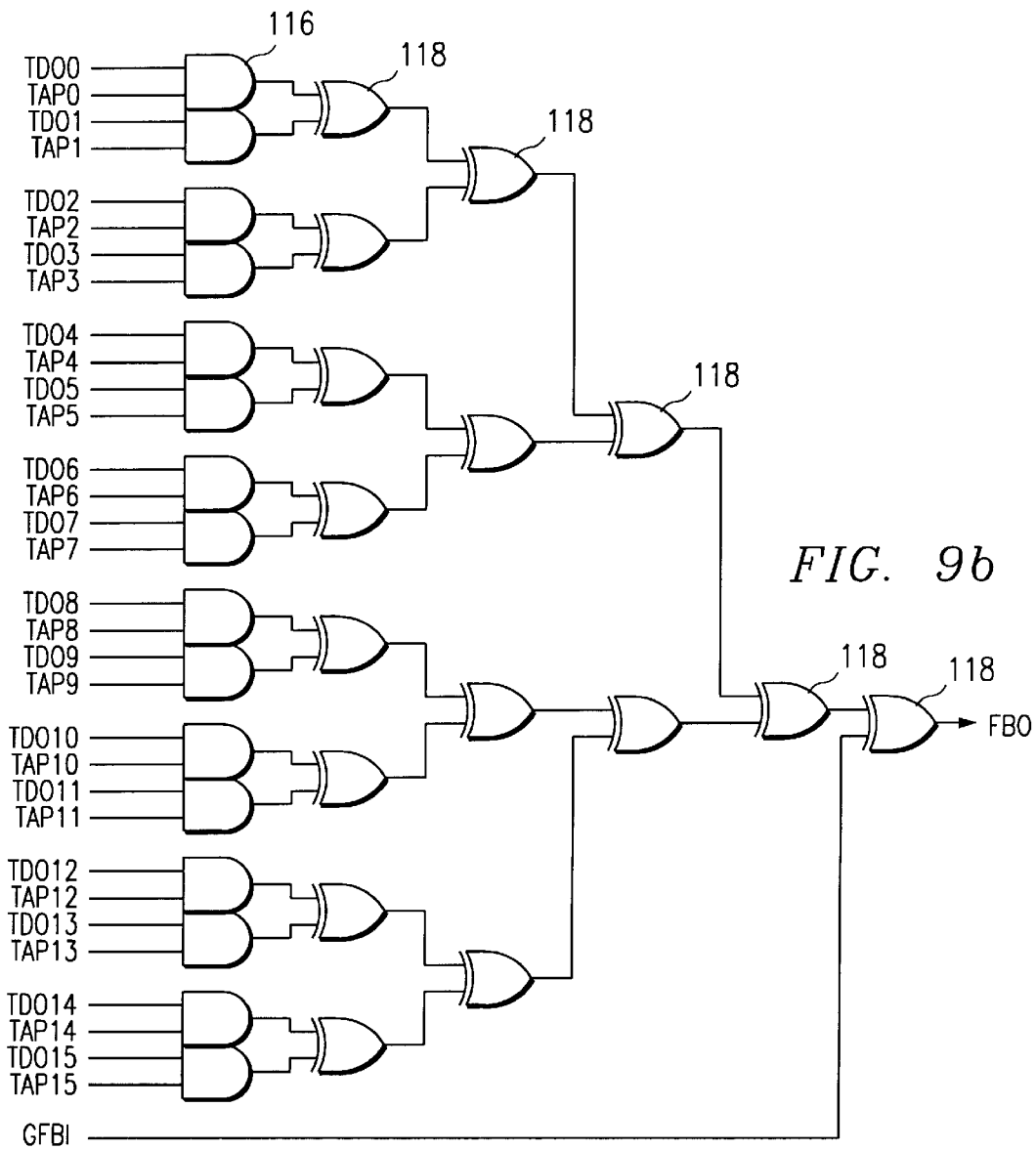
FIG. 9b illustrates a block diagram of the exclusive or gate network used in the test cell register of the present invention.

Referring to FIG. 9, the EXOR gate network 90 comprises an arrangement of AND gates 116 and EXOR gates 118 as shown in the example implementation of FIG. 9b. The EXOR gate network 90 receives input from the TDO outputs of the test cells in the test register 82, polynomial tap (TAP) select inputs from the TCR control register 26, and the external feedback input (FBI) (see FIG. 2). The EXOR gate network 90 outputs a feedback output (FBO) which is input to the first test cell of the test register 82 via multiplexer 84, and it is also output from the DBM 20 on the FBO signal. The TAP 1–15 inputs to the EXOR network 90 allow programmable selection of the TDO 0–15 outputs from the test register 82 that are to be included in the calculation of the FBO signal used during PSA operations. The external FBI input signal can be included in the calculation of FBO if the FBIENA input from the TCR control register 26 is set high; otherwise, data input on FBI is ignored by the EXOR network 90.

Referring again to FIG. 9, the CMPOUT0–15 outputs from the test cells in the test register are ANDed together and output from the TCR 28 via the CTERM signal. The CTERM signal is input to the EQM 32 as a condition input. The CMPOUT0–15 outputs reflect the result of a compare operation between ODI0–15 and EXPDAT0–15 signal buses input to the TCR 28. The CMPMSK0–15 inputs can be used to mask off one or more of these compare operations. When a compare logic section is masked off, its CMPOUT output is set to a high logic level.

The PSAENA input signal from the command register 36 to the test register 82 is used to select whether the test cells perform a PSA or sample operation. If PSAENA is set high, all test cells are selected for PSA operation. If PSAENA is low, all test cells are set for sample operation. The DATMSK0–15 signals from the TCR control register 26 are used to mask off one or more of the ODI0–15 signal inputs during either a PSA or sample operation. If a DATMSK input is low, the ODI input associated with it is masked off, and the test cell loads a low logic level during PSA or sample operations. If a DATMSK input is high, the logic level of the ODI input it is associated with is loaded into the test cell during a PSA or sample operation.

During off line PSA or sample instructions, the MODE2 input signal will be set to allow the L/S and DRCK4 signals from the test port 38 to be input to the test register 82 via multiplexers 86 and 88, respectively. During this test mode the L/S input signal will be set high, and the DRCK4 clock will be enabled by the external input to the test port 38. If a PSA operation is being performed, the PSAENA input to the test register is set high. If a sample operation is performed, the PSAENA input is set low. The data appearing on the ODI0–15 inputs is clocked into the test register cells during each high clock pulse on the DRCK4 input. After the PSA or sample operation is complete, the data or signature collected is shifted out for inspection via a TCR read instruction.

During on-line PSA or sample instructions, the mode 2 input signal will be set to allow the TGATE and SYNCK signals from the EQM 32 to be input to the test register via multiplexers 86 and 88. During this test mode, the TGATE signal will be set high to enable the SYNCK and to select the PSA/sample mode of operation in the test cells of the test register. The TGATE signal is set high in response to an input condition according to the type of protocol selected as shown in FIG. 7a, 7b, 7c, or 7d. If a PSA operation is being performed, the PSAENA input to the test register will be set high. If a sample operation is performed, the PSAENA is set low. The data appearing on the ODI0–15 inputs is clocked into the test register cells during each high clock pulse on the SYNCK input. After the PSA or sample operation is complete, the data or signature collected is shifted out for inspection via a TCR read instruction.

It should be noted that data can be stored sequentially in the memory buffer 30 while it is being compressed in the TCR 28.

The TCR 28 and memory buffer 30 may be controlled by both the external test bus controller 25 and the EQM 32. Since the external test bus controller 25 may be controlling a large number of DBMs and other devices, the internal EQM 32 provided the detailed control for reach DBM.

Advantages of Maskable PSA Inputs

Figure 9C:
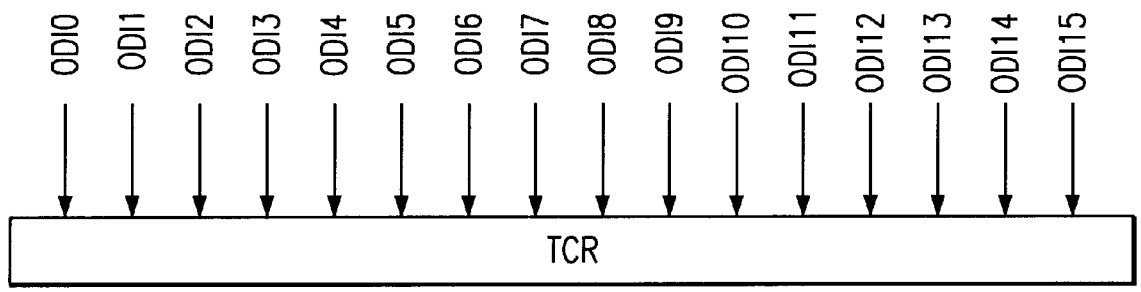
FIG. 9c illustrates a block diagram of signature analysis performed on all ODI inputs.

In FIG. 9c, the TCR of a DBM device is shown collecting a signature on multiple parallel ODI inputs. In this mode, the DATMSK 0–15 inputs to the TCR 28 from the TCR control register 26 are set to allow all ODI input signals to be involved in producing a signature value. After the signature is collected, it is shifted out and compared to what the signature should be equal to. If the signature collected does not match the correct value, a fault has occurred on one or more of the ODI inputs. It is difficult, if not impossible, to determine which ODI input or groups of inputs caused the signature to fail.

Since the DBM can mask off one or more of the ODI inputs, it is possible to repeat the test operation with only one ODI input enabled at a time. This capability can be used to collect a signature of one single ODI input at a time. Using this technique, it is possible to diagnose which ODI input or inputs caused the parallel signature to fail.

Figure 9D:
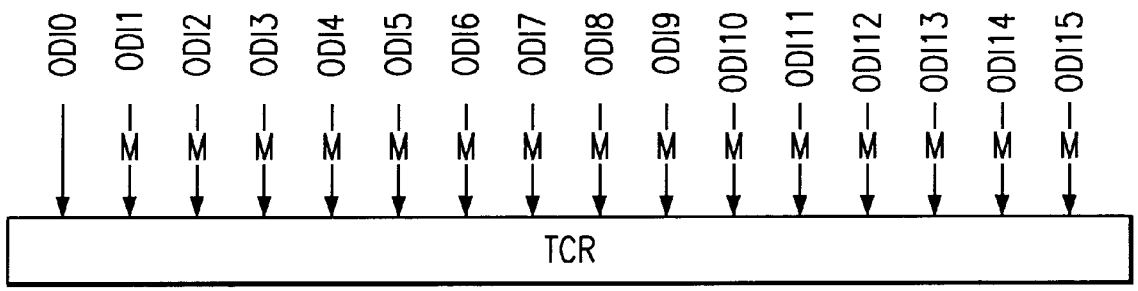
FIG. 9d illustrates a block diagram of signature analysis performed on an isolated ODI input.

In FIG. 9d, an example is shown wherein all the ODI input signals are masked off except for one, ODI0. By repeating the same test that failed with one ODI input enabled, a signature can be produced which reflects the data input only by the single enabled ODI input. After this single input signature is taken, it can be shifted out and compared to an expected signature for that ODI input. If it matches the expected signature, the ODI0 input is good and did not cause the parallel input signature to fail. If it does not match, it, along with other potentially bad ODI inputs, caused the parallel input signature to fail.

This process is repeated by enabling another single ODI input signal while masking off all others and repeating the test again to collect a signature from the enabled ODI input signal and comparing it to what it should be equal to. By following this procedure for all ODI inputs, it is possible to determine which ODI input or inputs caused the parallel signature to fail. This technique is useful in the diagnosis of failed parallel signature analysis operations. Without the capability to selectively enable one ODI input signal at a time, it would not be possible to employ this simple but thorough diagnostic test technique. It should be noted that this diagnostic test could also be performed by isolating groups of ODI inputs.

Cascading DBMs to Expand PSA Signature Width

Figure 10:
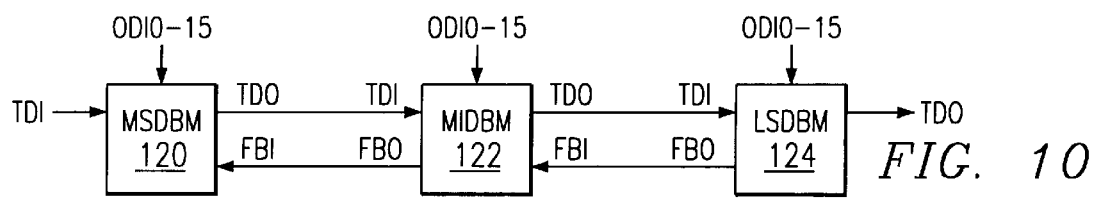
FIG. 10 illustrates a block diagram of the digital bus monitor feedback control for cascaded and non-cascaded PSA used in the present invention.

Expanding the width of the signature being taken can be performed through a series of coupled DBM integrated circuits as shown in FIG. 10. The DBMs in FIG. 10 are coupled in series from a most significant DBM (MSDBM) 120, through one of more middle DBMs (MIDBM) 122, to a least significant DBM (LSDBM). The TDO of each preceding DBM is connected to the TDI of the next DBM; the FBI of each preceding DBM is connected to the FBO of the next DBM.

For the MSDBM 120 in FIG. 10, the FBIENA and FBSEL inputs to the TCR 28 must both be set to a logic high level in cascaded applications. With this setting of FBIENA and FBSEL, the external FBI input to the MSDBM 120 is input to the MSDBMs EXOR network 90 via the AND gate 92 of FIG. 9 (GFBI), and the FBO output from the MSDBM's EXOR network 90 is input to the test register 82 via multiplexer 84 of FIG. 9.

For the MIDBM 122 in FIG. 10, the FBIENA and FBSEL inputs to the TCR 28 must be set to a logic high and low level, respectively, in cascaded applications. With this setting of FBIENA and FBSEL, the external FBI input to the MIDBM 320 is input to the MIDBM's EXOR network 90 via the AND gate 92 of FIG. 9 (GFBI), and the TDO output from the MSDBM is input to the test register 82 of the MIDBM 122 via the TDI input to the multiplexer 84 of FIG. 9. The FBO output from the MIDBM 122 is input to the FBI of the MSDBM 120.

For the LSDBM 124 in FIG. 10, the FBIENA and FBSEL inputs to the TCR 28 must both be set to a logic low level in cascaded applications. With this setting of FBIENA and FBSEL, the external FBI input to the LSDBM 124 is gated off and a low logic level is input to the LSDBM's EXOR network 90 via the AND gate in FIG. 9 (GFBI), and the TDO output from the MIDBM 122 is input to the test register 82 of the LSDBM 124 via the TDI input to multiplexer 84 of FIG. 9. The FBO output from the LSDBM 124 is input to the FBI of the MIDBM 122.

During non-cascaded PSA configurations, the FBIENA and FBSEL input to the TCR's of the MSDBM 120, MIDBM 122, and LSDBM 124 will be set to a low and high logic level, respectively. With this setting of FBIENA and FBSEL, the external FBI input to the TCR 88 is gated off, and a low logic level is input to the EXOR network 90 via the AND gate 92 in FIG. 9 (GFBI), and the internal FBO from the EXOR network is input to the test register 82 via multiplexer 84 in FIG. 9.

DBM Instructions

When an instruction is shifted into the command register 36, the appropriate control is output via the control bus 48 to execute a test or scan operation in one or more of the selectable data register scan paths; bypass register 34, EQM 32, memory buffer 30, TCR 28, or TCR control register 26.

During the off line data sample instruction, the TCR 28 receives control from the external test bus via test port 38 and control bus 48 to capture the data appearing on the ODI inputs. After the data is captured, it can be shifted out of the TCR for inspection via a TCR read instruction.

During the on line data sample instruction, the TCR 28 receives control from the internal EQM 32 via EQM control bus 52 to capture the data appearing on the ODI inputs. After the data is captured, it can be shifted out of the TCR 28 for inspection via a TCR read instruction.

During the off line parallel signature analysis (PSA) test instruction, the TCR 28 receives control from the external test bus via test port 38 and control bus 48 to compress the data appearing on the ODI inputs into a 16 bit signature. After the data is compressed, the resulting signature can be shifted out of the TCR 28 for inspection via a TCR read instruction.

During the on-line PSA test instruction, the TCR 28 receives control from the internal EQM 32 via EQM control bus 52 to compress the data appearing on the ODI inputs into a 16 bit signature. After the data is compressed, the resulting signature can be shifted out of the TCR for inspection via a TCR read instruction.

During the off-line data buffering instruction, the memory buffer 30 receives control from the external test bus via test port 38 and control bus 48 to store the data appearing on the ODI inputs into the internal RAM memory buffer 72. After the data has been stored, the memory contents can be shifted out for inspection via a memory read instruction.

During the on line data buffering instruction, the memory buffer 30 receives control from the internal EQM 32 via EQM control bus 52 to store the data appearing on the ODI inputs into the internal RAM memory buffer 72. After the data has been stored, the memory contents can be shifted out for inspection via a memory read instruction.

During the off line PSA and buffer instruction, the TCR 28 and the memory buffer 30 receive control from the external test bus via the test port 38 and control bus 48 to compress and store, respectively, the data appearing on the ODI inputs. After the data has been compressed into the TCR 28 and stored into the RAM memory 72, it can be shifted out for inspection by executing a TCR read instruction to access the signature in the TCR 28, followed by executing a memory read instruction to access the memory contents.

During the on line PSA and buffer instruction, the TCR 28 and the memory buffer 30 receive control from the internal EQM 32 via EQM control bus 52 to compress and store, respectively, the data appearing on the ODI inputs. After the data has been compressed into the TCR and stored into the RAM memory 72, it can be shifted out for inspection by executing a TCR read instruction to access the signature in the TCR 28, followed by executing a memory read instruction to access the memory contents.

During the TCR read instruction, the TCR 28 receives control from the external test bus via the test port 38 and control bus 48 to shift data from the TDI input, through the TCR 28, and out of the DBM 20 via the TDO output pin. This instruction is used to access the data captured or compressed in the TCR during a data sample or PSA instruction.

During the TCR control scan instruction, the TCR control register 26 receives control from the external test bus via the test port 38 and control bus 48 to shift data from the TDI input, through the TCR control register 26, and out of the DBM 20 via the TDO output pin. This instruction is used to load control bit signals required to set up the TCR's input data mask logic and polynomial feedback tap connections for a particular data sample or PSA test operation.

During the bypass scan instruction, the bypass register 34 receives control from the external test bus via the test port 38 and control bus 48 to shift data from the TDI input, through the bypass scan cell 34, and out of the DBM 20 via the TDO output pin. This instruction is used to shorten the scan path through the DBM to only a single scan cell or flip flop.

During the memory read instruction, the memory buffer 30 receives control from the external test bus via the test port 38 and control bus 48 to load and shift out the currently addressed memory location via the TDI input and TDO output pins. During the shift out operation the next memory address to be read is shifted into the memory buffer 30.

During the memory write instruction, the memory buffer 30 receives control from the external test bus via the test port 38 and control bus 48 to load the contents in the data section of memory scan path into the memory location addressed by the address section of the memory scan path. This instruction is used to initialize the memory buffer to a known state for test monitoring and self testing purposes.

Although the present invention has been described in detail, it should be understood that various changes, substitutions and alterations can be made herein without departing from the spirit and scope of the invention as defined by the appended claims.

What is claimed is:

1. The process of testing circuits comprising:
    A. operating the circuits at normal operating speeds to produce control signals on control bus leads, data signals on data bus leads, and address signals on address bus leads;
    B. observing the signals on at least one of the data bus leads and the address bus leads;
    C. capturing certain observed signals in a monitor device; and
    D. shifting the captured signals out of the monitor device on a serial path that extends into and out of the monitor device.

2. The process of claim 1 in which the observing includes observing signals on both of the data bus leads and the address bus leads.

3. The process of claim 1 in which the observing includes observing signals on both of the data bus leads and the address bus leads and on control bus leads.

4. The process of claim 1 in which the operating includes producing a clock signal on at least one control bus lead and in which the observing includes observing signals in synchronism with the clock signal.

5. The process of claim 1 in which the capturing includes matching the observed signals with at least one certain data pattern.

6. The process of claim 1 in which the capturing includes matching the observed signals with at least one certain data pattern stored in a memory.

7. The process of claim 6 in which the matching includes masking at least one bit of the certain data pattern.

8. The process of claim 1 in which the capturing includes matching the observed signals with at least one certain data pattern stored in a first memory and storing the matched signals in a second memory.

9. The process of claim 1 in which the shifting occurs during the operating.

10. A process of testing circuits comprising:
    A. operating the circuits at normal operating speeds to produce signals on leads;
    B. observing the signals on the leads;
    C. capturing certain observed signals in a monitor device; and
    D. shifting the captured signals out of the monitor device on a serial path that extends into and out of the monitor device.

11. The process of claim 10 in which the operating includes producing signals in synchronism with a clock signal.

12. The process of claim 10 in which the operating includes producing signals in synchronism with a clock signal and the observing includes observing the signals in synchronism with the clock signal.

13. The process of claim 10 in which the capturing includes matching the observed signals with certain expected signals.

14. The process of claim 10 in which the capturing includes storing the observed signals upon the observed signals matching with certain expected signals.

15. The process of claim 10 in which the shifting includes shifting a on a serial path in synchronism with a test clock signal.

16. The process of claim 10 in which the shifting occurs during the operating.

17. A process of testing circuits comprising:
    A. operating the circuits on a substrate at normal operating speeds to produce control signals, including an operating clock signal, on control bus leads, data signals on data bus leads, and address signals on address bus leads, the operating including producing the data signals and address signals in synchronism with the operating clock signal;
    B. observing the signals on at least one of the data bus leads and the address bus leads in synchronism with the operating clock signal by receiving the signals in a monitor device on the substrate while leading the signals substantially unaffected, the observing occurring during the operating;
    C. capturing certain observed signals in the monitor device, the capturing including matching the observed signals with certain expected signals and storing the matching signals in the monitor device, the capturing occurring during the operation; and
    D. shifting the stored matching signals out of the monitor device on a serial path on the substrate in synchronism with a test clock signal, the shifting occurring during the operating.

18. The process of claim 17 in which the operating includes operating the circuits on a circuit board substrate.

19. A process of testing circuits comprising:
    A. operating the circuits on a substrate at normal operating speeds to produce signals;
    B. observing the signals by receiving the signals in a monitor device on the substrate while leaving the signals substantially unaffected, the observing occurring during the operating;
    C. capturing certain observed signals in the monitor device, the capturing including matching the observed signals with certain expected signals and storing the matching signals in the monitor device, the capturing occurring during the operating; and
    D. shifting the stored matching signals out of the monitor device on a serial path on the substrate in synchronism with a test clock signal, the shifting occurring during the operation.

20. The process of claim 19 in which the operating includes operating the circuits on a circuit board substrate.

21. A process of making circuits comprising:
   A. forming circuits, leads and a monitor device on a substrate including interconnecting the circuits and monitor device with control bus leads, data bus leads and address bus leads, and forming serial path leads, separate from the bus leads, to and from the monitor device;
   B. operating the circuits at normal operating speeds to produce control signals, including an operating clock signal, on the control bus leads, data signals on the data bus leads, and address signals on the address bus leads, the operating including producing the data and address signals synchronous with the operating clock signal;
   C. observing the signals while leaving the signals substantially unaffected, the observing including receiving the clock signal and the signals on at least one of the data bus leads and the address bus leads in the monitor device;
   D. capturing certain observed signals in a memory in the monitor device, the capturing including matching the received signals with certain expected signals and storing the matching signals in the monitor device; and
   E. shifting the captured signals out of the monitor device on the serial path leads in synchronism with a test clock signal during the operating.

22. The process of claim 21 in which the forming includes forming the circuits, leads, and monitor device on a circuit board substrate.

23. A process of making circuits comprising:
   A. forming circuits, interconnected with operating leads, and a monitor device connected to the operating leads and connected to separate serial path input and output leads;
   B. operating the circuits at normal operating speeds to produce signals on the operating leads;
   C. observing the signals on the operating leads;
   D. capturing certain observed signals in the monitor device; and
   E. shifting the captured signals out of the monitor device on the serial path leads.

24. The process of claim 23 in which the operating includes producing signals in synchronism with a clock signal.

25. The process of claim 23 in which the operating includes producing signals in synchronism with a clock signal and the observing includes observing the signals in synchronism with the clock signal.

26. The process of claim 23 in which the capturing includes matching the observed signals with certain expected signals.

27. The process of claim 23 in which the capturing includes storing the observed signals upon the observed signals matching with certain expected signals.

28. The process of claim 23 in which the shifting includes shifting on a serial path in synchronism with a test clock signal.

29. The process of claim 23 in which the shifting occurs during the operating.

30. The process of claim 23 in which the observing includes leaving the signals substantially unaffected.

31. A process of making circuits comprising:
   A. forming circuits and a monitor device on a substrate;
   B. operating the circuits at normal operating speeds to produce signals;
   C. observing the signals by receiving the signals in the monitor device while leaving the signals substantially unaffected, the observing occurring during the operating;
   D. capturing certain observed signals in the monitor device, the capturing including matching the observed signals with certain expected signals and storing the matching signals in the montior device, the capturing occurring during the operating; and
   E. shifting the stored matching signals out of the monitor device on a serial path on the substrate in synchronism with a test clock signal, the shifting occurring during the operating.

32. The process of claim 31 in which the forming includes forming the circuits and monitor device on a circuit board substrate.

33. The process of claim 31 in which the operating includes producing signals in synchronism with a clock signal.

34. The process of claim 31 in which the operating includes producing signals in synchronism with a clock signal and the observing includes observing the signals in synchronism with the clock signal.

35. The process of claim 31 in which the capturing includes matching the observed signals with certain expected signals.

36. The process of claim 31 in which the capturing includes storing the observed signals upon the observed signals matching with certain expected signals.

37. The process of claim 31 in which the shifting includes shifting on a serial path in synchronism with a test clock signal.

38. The process of claim 31 in which the shifting occurs during the operating.

39. The process of claim 31 including shifting expected compare data into the monitor device on a test data input lead of the serial path.

40. The process of claim 31 including shifting mask compare data into the monitor device on a test data input lead of the serial path.

* * * * *